United States Patent [19]

Gansert et al.

[11] 4,103,321

[45] Jul. 25, 1978

[54] COMPOSITE ELECTRIC CIRCUIT STRUCTURE OF A PRINTED CIRCUIT AND HEAT GENERATING DISCRETE ELECTRICAL COMPONENT

[75] Inventors: Willi Gansert, Kornwestheim; Martin Zipperer, Hildesheim, both of Fed. Rep. of Germany

[73] Assignee: Robert Bosch GmbH, Stuttgart, Fed. Rep. of Germany

[21] Appl. No.: 751,669

[22] Filed: Dec. 17, 1976

[30] Foreign Application Priority Data

Jan. 13, 1976 [DE] Fed. Rep. of Germany ....... 2601035

[51] Int. Cl.² ............................................... H05K 7/20
[52] U.S. Cl. ............................... 361/388; 174/16 HS; 357/81
[58] Field of Search ............... 361/386, 388, 389, 400; 174/16 HS; 338/316; 357/81

[56] References Cited

U.S. PATENT DOCUMENTS

| 3,465,212 | 9/1969 | Grimes | 357/81 |
| 3,585,272 | 6/1971 | Shatz | 174/16 HS |

*Primary Examiner*—Gerald P. Tolin
*Attorney, Agent, or Firm*—Flynn & Frishauf

[57] ABSTRACT

To prevent failure of solder connections between projecting pins from discrete electrical components, such as power transistors, and printed circuit paths formed on an insulated substrate, the space between the semiconductor and an attached cooling plate in the region of the pin is increased to permit lateral excursion of the pin, without electrical contact with the cooling plate, and thus prevent failure of the solder connection. The space can be increased by, for example, the relieving the thickness of the cooling plate in the region where the pin passes therethrough, or spacers can be inserted between the cooling plate and the insulating board on which the printed circuit is carried, both solutions providing for some flexibility of the mounting and hence deflection of the connecting pin from the semiconductor to the solder connection.

4 Claims, 4 Drawing Figures

COMPOSITE ELECTRIC CIRCUIT STRUCTURE OF A PRINTED CIRCUIT AND HEAT GENERATING DISCRETE ELECTRICAL COMPONENT

The present invention relates to a composite electrical circuit structure in which a discrete electrical element, for example a power transistor or other power semiconductor unit, is attached to a carrier board, for example a printed circuit, by means of a solder connection, and particularly to such a composite circuit structure which may be subject to severe temperature and mechanical conditions including shock, vibration, and the like, and which is so constructed that failure of the solder connection is effectively prevented.

Electric circuit elements which are secured to substrates formed by printed circuits, particularly such circuit elements which include heat sinks or cooling plates to dissipate power losses in the structure, have proved difficult to reliably maintain electrical connection from an extending connecting pin to the printed circuit. Usually, the heat sink is formed as a plate parallel to the printed circuit, the connecting pin from the electrical element passing through a hole in the cooling pin and through openings in the plate as well as through a solder opening in the printed circuit board. The arrangement in which the electrical circuit component is secured to the plate with the interposition of the heat sink or cooling plate results in failure of the solder connection upon changes in temperature, shock or vibration, due to tension and compression forces being exerted against the solder connection, resulting in fissures in the solder connection and eventual failure thereof.

It is an object of the present invention to reliably connect a circuit element, particularly a power semiconductor circuit element, to a printed circuit with the interposition of a heat sink plate in which failure of the solder connection of the element to a printed circuit connection on the printed circuit substrate is effectively avoided.

Subject matter of the present invention: Briefly, the space beneath the electrical element in the region of the pin is increased laterally as well as axially on and beyond the hole necessary to isolate the connecting pin from the heat sink or heat-dissipating plate. Particularly, a chamber-like space is formed beneath the electrical circuit element, to permit some slight movement between the element and the heat sink or heat-dissipating plate and, further, between the element, the plate and the substrate, and thus prevent application of forces due to temperature changes, vibration and the like from being transmitted to the solder connection between the pin and the circuit conductor applied to the substrate plate, and hence failure of the solder connection.

In accordance with an embodiment of the invention, the heat sink or heat-dissipating plate is relieved in its thickness in a region surrounding the pin, thus forming said chamber; in accordance with another embodiment of the invention, spacers are interposed between the heat sink or heat-dissipating plate and the substrate plate, so that the heat-dissipating plate will be in intimate contact with the electrical circuit element, while forming an open chamber beneath the heat-dissipating plate and the substrate plate, defined by the spacers which are interposed between said plates.

The invention will be described by way of example with reference to the accompanying drawings, wherein.

Figure 1:
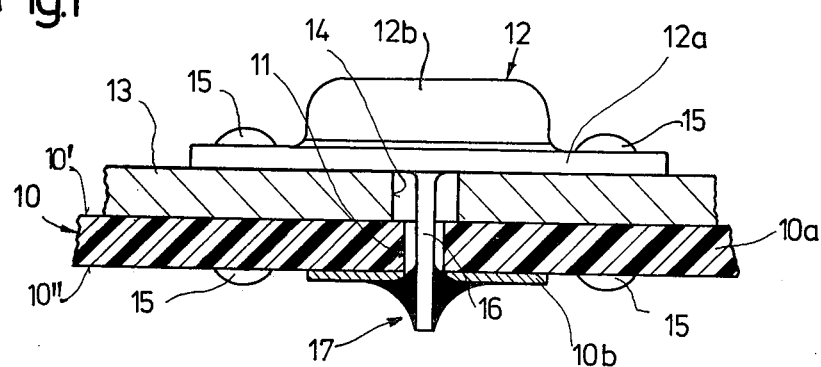
FIG. 1 is a schematic front view, partly in section, showing the attachment of a power semiconductor element to a printed circuit board with an interposed heat-dissipating plate, as constructed in accordance with the prior art.

A printed circuit 10 consists of a substrate carrier or board 10a on which a circuit 10b is attached to one side thereof. The carrier 10a may be of any well-known and customary material, such as plastic, XXX-P board, or any other conventional printed circuit substrate material. One of the printed circuit conductors only is illustrated at 10b, located against the lower surface 10" of the board 10a. A semiconductor power rectifier 12 is located on the upper side 10' of the printed circuit 10, with the interposition of an aluminum sheet metal heat-dissipating plate 13. Plate 13 cools the element 12 and is a flat plane-parallel plate. Plate 13 is formed with a central bore 14 which is located coaxially with respect to opening 11 on printed circuit 10. The rectifier 12 has a base plate 12a and a cap 12b welded to the base plate 12a. The bottom of the base plate 12a is in intimate thermal contact with plate 13. The rectifier 12, cooling plate 13 and printed circuit board 10 are attached together by two rivets 15 passing through respective bores formed in all three elements and connecting together the socket 12a of the rectifier 12, heat sink plate 13 and the insulating plate 10a of the printed circuit board 10. A pin-like extension 16 extends from the rectifier 12. Connecting pin 16 extends through the bore 14 and through openings 11 and beyond the printed circuit layer or coating forming the conductor 10b. Electrical connection between pin 16 and conductor 10b is effected by a solder connection 17.

Figure 2:
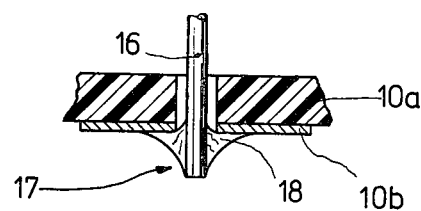
FIG. 2 is a fragmentary view of the solder connection, with difficulties arising with the solder connection in accordance with the prior art.

In operation, temperature changes, vibration and shock cause tension and compression forces to act on the solder connection 17, resulting in fissures 18, seen in FIG. 2, which lead to failure of the solder connection.

The electrical component 12 has been shown as a power semiconductor diode or semiconductor rectifier for purposes of illustration only; any other electrical component can be used, e.g. having more than one pin connection as shown, and the present invention is applicable to relieve stresses on the solder connections acting between all the respective pins and conductive connections. Electrical conductors applied to the substrate 10a and in electrical contact, for example, with the base plate 12a of rectifier 12, and applied, for example, to the upper surface 10' of insulating board 10a, have been omitted for clarity.

Figure 3:
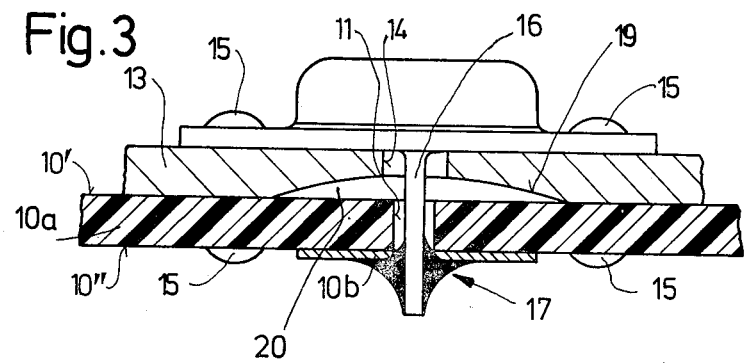
FIG. 3 is a view similar to FIG. 1 and illustrating the arrangement in accordance with one embodiment of the present invention.

In accordance with the present invention, a chamber-like opening is formed in the region surrounding the pin 16 beneath the component 12 between the heat-dissipating or heat sink plate 13 and the insulating board 10a. Formation of such a chamber effectively prevents damage to the solder connection 17. The resulting chamber 20 (FIG. 3) permits differential expansion or contraction and relief of compressive or tensile forces acting on the solder connection 17. In accordance with a feature of the invention, the chamber 20 is formed by a relief of the thickness of plate 13 in the region surrounding the pin 16. This relief 19 is so made that the plate 13 is formed with a concave, dish-like inner surface, reducing the thickness of the plate in the region of the opening 14 through which pin 16 passes. The dish-like relief 19 forming the chamber 20 preferably extends laterally of the pin 16 to the vicinity of the attachment points defined by the rivets 15. The relief, as shown, may extend to about half the thickness of the plate 13, although this dimension is not critical and may be varied in accordance with expected temperature differences, mechanical strength and the like.

Figure 4:
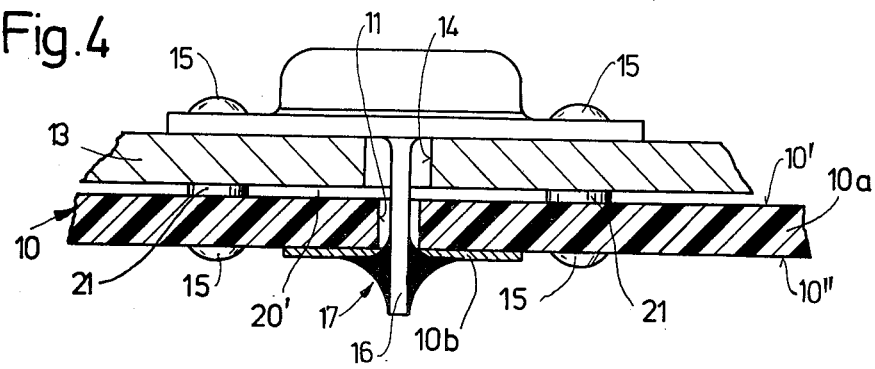
FIG. 4 is a view similar to FIG. 1 showing the arrangement in accordance with another embodiment of the present invention.

In accordance with another embodiment of the invention, a chamber 20' (FIG. 4) is formed by introducing spacers 21 surrounding rivets 15. The chamber 20' effectively permits compressive or tensile forces acting on the solder connection 17 to be shunted aside or absorbed and to permit some relative flexing of the assembly and thus prevent stress on the solder connection 17.

Various changes and modifications may be made and features described in connection with any one embodiment may be used with any of the others, within the scope of the inventive concept.

We claim:

1. Composite electric circuit structure comprising
   a printed circuit (10) having a substrate plate (10a) of insulating material, formed with an opening (11) therethrough;
   a conductive layer or coating (10b) on at least one surface (10") of said substrate plate;
   a discrete electrical component (12) located at the side of the other surface (10') of the substrate (10a) plate and having a connecting pin (16) passing through said opening (11);
   a cooling plate (13) located between the other substrate plate surface (10') and the electrical component (12) to dissipate heat generated in said component during passage of current therethrough and formed with an opening (14) therethrough for passage, with clearance, of the connecting pin;
   attachment means (15) passing through said component (12), the cooling plate (13) and the substrate plate (10a) and clamping the electrical component, the cooling plate and the substrate plate together;
   a solder connection (17) between the connecting pin (16) extending from the electrical component (12) and the conductive layer or coating (10b);
   a relief (19) formed in said cooling plate (13) reducing the thickness of said cooling plate in the region of the opening (14) surrounding said pin (16),
   extending in the direction of the pin (16) and laterally thereof beneath the electrical component and located between the other surface (10') of the substrate plate (10a) and the surface of the electrical component (12) facing said other surface (10') to form a chamber between said other surface (10') of the substrate plate (10a) and the facing surface of the cooling plate (13).

2. Circuit structure according to claim 1, wherein the relieved surface is essentially dish-shaped and forms a depression in said cooling plate (13) surrounding the opening (14)therein.

3. Circuit structure according to claim 1, wherein the relieved surface extends to the vicinity of the attachment means (15).

4. Circuit structure according to claim 2 wherein said relieved surface extends to the vicinity of the attachment means connecting said component (12), the cooling plate (13) and the substrate plate (10a).

* * * * *